(12) United States Patent
Chang et al.

(10) Patent No.: US 7,833,628 B2
(45) Date of Patent: Nov. 16, 2010

(54) COATING STRUCTURE WITH AN ANTI-REFLECTION FUNCTION AND AN ANTI-ELECTROMAGNETIC WAVE FUNCTION

(75) Inventors: Cheng-Chieh Chang, Taipei (TW); Shiu-Feng Liu, Jhongli (TW); Pi-Jui Kuo, Jhubei (TW)

(73) Assignee: Innovation & Infinigy Global Corp., Hsinchu (TW)

( * ) Notice: Subject to any disclaimer, the term of this patent is extended or adjusted under 35 U.S.C. 154(b) by 306 days.

(21) Appl. No.: 12/007,063

(22) Filed: Jan. 7, 2008

(65) Prior Publication Data
US 2009/0176057 A1    Jul. 9, 2009

(51) Int. Cl.
*B32B 7/00* (2006.01)
*B32B 15/00* (2006.01)

(52) U.S. Cl. .................. 428/432; 428/212; 428/472; 428/688; 428/689; 428/697; 428/699; 428/702; 428/701

(58) Field of Classification Search ............. None
See application file for complete search history.

(56) References Cited

U.S. PATENT DOCUMENTS

2002/0086164 A1* 7/2002 Anzaki et al. ............... 428/432
2006/0088690 A1* 4/2006 Arakawa et al. ............ 428/138

* cited by examiner

*Primary Examiner*—Ling Xu
(74) *Attorney, Agent, or Firm*—Rosenberg, Klein & Lee

(57) ABSTRACT

A coating structure with an anti-reflection function and an anti-electromagnetic wave function, including an anti-reflection coating structure, an anti-electromagnetic wave coating structure, a third transparent substrate, and two adhesive layers respectively disposed between the anti-reflection coating structure and the third transparent substrate and between the third transparent substrate and the anti-electromagnetic wave coating structure. The anti-reflection coating structure has a first transparent substrate and an anti-reflection coating module formed on the first transparent substrate. The anti-electromagnetic wave coating structure has a second transparent substrate and an anti-electromagnetic wave coating module formed on the second transparent substrate. The third transparent substrate is disposed between the anti-reflection coating structure and the anti-electromagnetic wave coating structure.

9 Claims, 2 Drawing Sheets

COATING STRUCTURE WITH AN ANTI-REFLECTION FUNCTION AND AN ANTI-ELECTROMAGNETIC WAVE FUNCTION

BACKGROUND OF THE INVENTION

1. Field of the Invention

The present invention relates to a coating structure, and particularly relates to a coating structure with an anti-reflection function and an anti-electromagnetic wave function.

2. Description of the Related Art

In the raw photo material production industry, an anti-reflection layer panel is the most important raw material. The importance of the raw optical-electrical material production industry is increasing while simultaneously there are growing requests for an improved yield, greater control of the process, reducing costs, and mass-producing for the optical-electrical product. The importance of the raw optical-electrical material production industry is almost the same as the semiconductor industry. The technology for producing anti-reflection layer panels is related to a variety of optical-electrical industries, such as LCD, OLED, FED, photo lens, etc. The specifications for an anti-reflection layer panel depend on the requirements of each industry. However, when a large dimension panel is produced, it needs to be composed of better raw material because for large dimension panels of the conventional art a nebulizing technique is used to create the surface structure.

The anti-reflection layer panel is a basic raw material for the optical-electrical industry. Almost all high-class panels use an anti-reflection layer panel. The anti-reflection layer panel and other electronic elements are assembled into an optical-electrical structure as an optical-electrical product to provide a specified function. For the anti-reflection layer panel, the desired characteristics are being light pervious and anti-reflection.

It is well known that the conventional layer structure for an anti-reflection optical coating has a general principle. This general principle is that the surface layer of the optical coating should be a material that has a low refractive index such as $SiO_2$, with a refractive index of 1.46, or $MgF_2$, with a refractive index of 1.38. However, when we apply the metal base anti-reflection coating on a display screen to create a high EMI shielding effect for a computer monitor, or low reflection glass for an LCD or a PDP, there are some bottlenecks in the process for high volume mass production. The basic reason for this is that the protective layer for example $SiO_2$ or $MgF_2$ of the optical layer structure is naturally porous and allows the $H_2O$ vapor to diffuse into the inside low resistivity metal thin layer to change the electric and optical characteristic of the layer system.

On the other hand, in the general design rule for an anti-reflection coating, the first layer deposited on the substrate surface is a material with a high refractive index (hereafter referred to as H), which is then followed by a second layer that is a material with a low refractive index (hereafter referred to as L). The basic design rule for the conventional anti-reflection coating is that there is a layer structure such as HLHL or HLHLHL. In a simple case, if the materials of H are ITO and the materials of L are $SiO_2$, the 4-layered structure is glass/$ITO/SiO_2/ITO/SiO_2$. Because ITO is a transparent conductive material, the multi-layer coating of this layer structure has electrical conductivity of less than 100 Ω/square, and can be used as an EMI shielding and/or electric static discharge when the conductive coating layer is bonded to the ground. However, electronic circuits have moved to faster speed and more powerful functions, and extreme low resistivity, namely $\leq 0.6$ Ω/square, is required to provide better EMI (Electronic magnetic Interference) shielding. Conventional multi-layer ITO coatings have good performance in the resistivity range of several Ω/square. However, resistivities below 1.0 Ω/square much increase the difficulty of mass production and result in very high cost of the final product.

On the other hand, although a thin metal layer has good electrical conductivity, metal also has many limitations for forming a multi optical layer system.

A well know phenomenon of thin film metal layers is their limited durability. Once water vapor diffuses into the surface and contacts the thin metal layer, an oxidation process will occur spontaneously and finally change the chemical property of thin metal layer and significantly change the electrical and optical characteristic of the optical layer system. A design of special compound layer was used as a surface protect layer for this invention. This surface protective layer is composed of Titanium oxide, Silicon dioxide and Aluminum oxide. The protective layer is an effective diffusion barrier to prevent the water vapor diffuse from the surface into inner metal layer.

SUMMARY OF THE INVENTION

One particular aspect of the present invention is to provide a coating structure with an anti-reflection function and an anti-electromagnetic wave function.

In order to achieve the above-mentioned aspects, the present invention provides a coating structure with an anti-reflection function and an anti-electromagnetic wave function, including an anti-reflection coating structure, an anti-electromagnetic wave coating structure, a third transparent substrate, and two adhesive layers respectively disposed between the anti-reflection coating structure and the third transparent substrate and between the third transparent substrate and the anti-electromagnetic wave coating structure. The anti-reflection coating structure has a first transparent substrate and an anti-reflection coating module formed on the first transparent substrate. The anti-electromagnetic wave coating structure has a second transparent substrate and an anti-electromagnetic wave coating module formed on the second transparent substrate. The third transparent substrate is disposed between the anti-reflection coating structure and the anti-electromagnetic wave coating structure.

Therefore, the coating structure with the anti-reflection function and the anti-electromagnetic wave function of the present invention has some advantages, as follows:

1. The coating structure of the present invention is used in the optical-electrical industry that needs the anti-reflection layer to be the raw material (such as LCD, computer goggles, glasses, high-class display, FED, or photo sensor). It produces the boards that are cheap and has high quality.

2. The coating structure of the present invention has a highly conductive property for EMI (Electromagnetic Interference) shielding, has low reflectivity for optical viewing, is highly scratch resistance for surface hardness, and has moderate light attenuation effects for manufacturing PDP displays.

3. The coating structure of the present invention has good electrical conductive properties, so that the work in the grounding process can be reduced and the total yield and reliability in high volume production can be increased.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1:
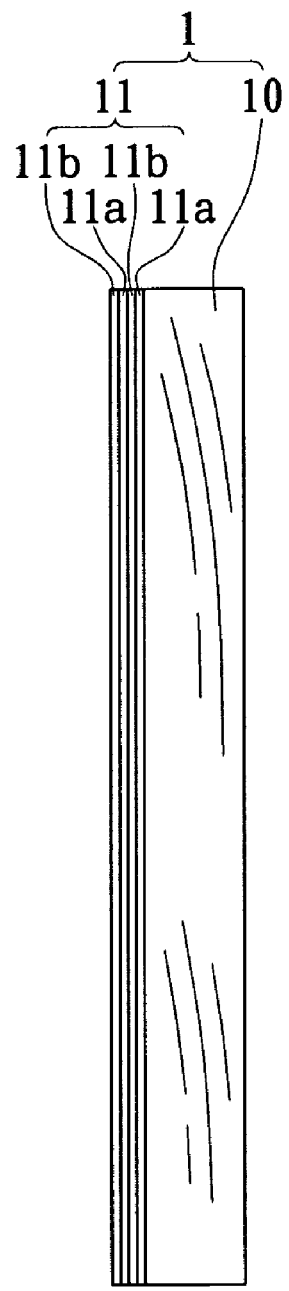
FIG. 1 is a schematic view of an anti-reflection coating structure of the present invention.
Figure 2:
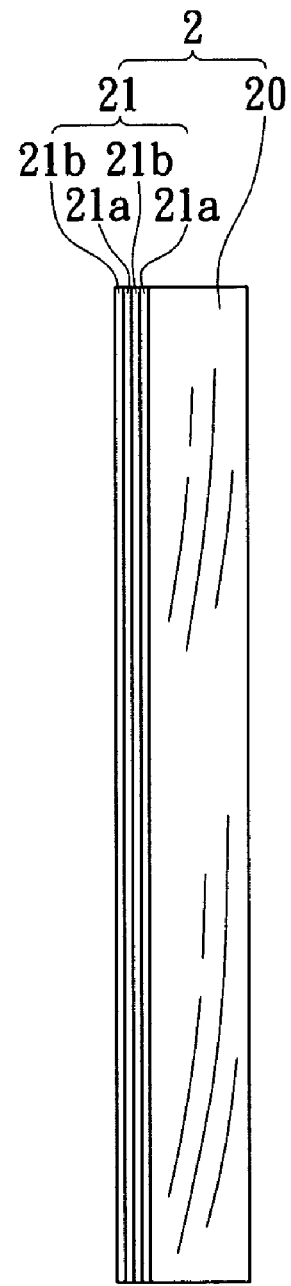
FIG. 2 is a schematic view of an anti-electromagnetic wave coating structure of the present invention.
Figure 3:
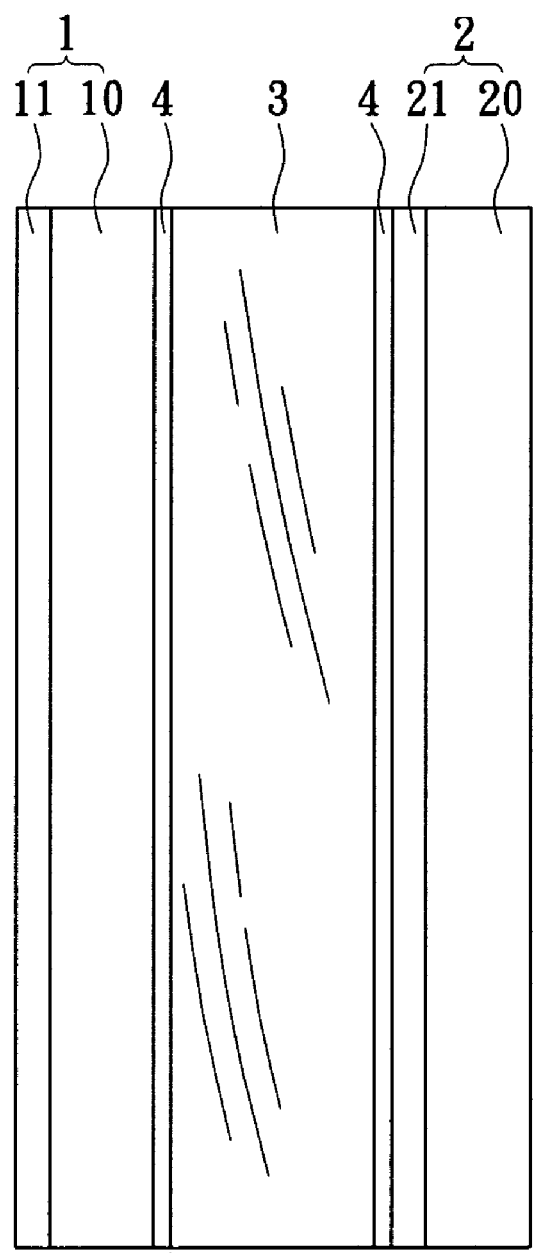
FIG. 3 is a schematic view of a coating structure with an anti-reflection function and an anti-electromagnetic wave function of the present invention.

Referring to FIGS. 1 to 3, FIG. 1 shows a schematic view of an anti-reflection coating structure of the present invention, FIG. 2 shows a schematic view of an anti-electromagnetic wave coating structure of the present invention, and FIG. 3 shows a schematic view of a coating structure with an anti-reflection function and an anti-electromagnetic wave function of the present invention.

Such as FIG. 1, the present invention provides an anti-reflection coating structure 1 that has a first transparent substrate 10 and an anti-reflection coating module 11 formed on the first transparent substrate 10. In addition, the first transparent substrate 10 can be made of PET (Polyethylene Terephthalate), and the first transparent substrate 10 has a thickness between 150 µm and 200 µm.

Moreover, the anti-reflection coating module 11 can be composed of a plurality of first oxide coating layers 11a and a plurality of second oxide coating layers 11b that are alternatively stacked upon each other. Each first oxide coating layer 11a has a refractive index larger than that of each second oxide coating layer 11b. However, above-mentioned layer number of the first oxide coating layers 11a and the second oxide coating layers 11b does not used to limit the present invention, for example, at least two or many first oxide coating layers and second oxide coating layers can be applied to the present invention.

Furthermore, the anti-reflection coating module 11 has two embodiment aspects, as follows:

1. First embodiment aspect: each first oxide coating layer 11a is a metal oxide, and each second oxide coating layer 11b is a non-metal oxide.

2. Second embodiment aspect: each first oxide coating layer 11a is made of ITO (Indium Tin Oxide), $Nb_2O_5$ or ZnO, and each second oxide coating layer 11b is made of $SiO_2$.

Moreover, such as FIG. 2, the present invention provides an anti-electromagnetic wave coating structure 2 that has a second transparent substrate 20 and an anti-electromagnetic wave coating module 21 formed on the second transparent substrate 20. In addition, the second transparent substrate 20 can be made of PET (Polyethylene Terephthalate), and the second transparent substrate 20 has a thickness between 100 µm and 150 µm.

Furthermore, the anti-electromagnetic wave coating module 21 is composed of a plurality of compound coating layers 21a and a plurality of metal coating layers 21b that are, alternatively stacked upon each other. Each compound coating layer 21a has a refractive index larger than that of each metal coating layer 21b.

However, above-mentioned layer number of the compound coating layers 21a and the metal coating layers 21b does not used to limit the present invention, for example, at least two or many compound coating layers and metal coating layers can be applied to the present invention.

In addition, the anti-electromagnetic wave coating module 21 has six embodiment aspects, as follows:

1. First embodiment aspect: one compound coating layer 21a close to the second transparent substrate 20 is $TiO_2$, the other compound coating layers 21a are ZnO:Al, and each metal coating layer 21b is Ag (silver).

2. Second embodiment aspect: one compound coating layer 21a close to the second transparent substrate 20 is $TiO_2$, the other compound coating layers 21a are SnO:Sb, and each metal coating layer 21b is Ag.

3. Third embodiment aspect: each compound coating layer 21a is a silicon carbide compound coating layer, the silicon carbide compound coating layer is a SiC, and each metal coating layer 21b is Ag.

4. Fourth embodiment aspect: each compound coating layer 21a is a Ti-based oxide coating layer, the Ti-based oxide coating layer is a $TiO_2$, and each metal coating layer 21b is Ag.

5. Fifth embodiment aspect: each compound coating layer 21a is composed of a silicon carbide compound and a Ti-based oxide, the silicon carbide compound is a SiC, the Ti-based oxide is $TiO_2$, and each metal coating layer 21b is Ag.

6. Sixth embodiment aspect: each compound coating layer 21a is composed of a Ti-based oxide and a carbon, the Ti-based oxide is $TiO_2$, and each metal coating layer 21b is Ag.

Furthermore, such as FIG. 3, the present invention provides a coating structure with an anti-reflection function and an anti-electromagnetic wave function. The coating structure includes an anti-reflection coating structure 1 (such as FIG. 1), an anti-electromagnetic wave coating structure 2 (such as FIG. 2), a third transparent substrate 3, and two adhesive layers 4 respectively disposed between the anti-reflection coating structure 1 and the third transparent substrate 3 and between the third transparent substrate 3 and the anti-electromagnetic wave coating structure 2.

The anti-reflection coating structure 1 has a first transparent substrate 10 and an anti-reflection coating module 11 formed on the first transparent substrate 10. The anti-electromagnetic wave coating structure 2 has a second transparent substrate 20 and an anti-electromagnetic wave coating module 21 formed on the second transparent substrate 20. The third transparent substrate 3 is disposed between the anti-reflection coating structure 1 and the anti-electromagnetic wave coating structure 2. In addition, both the first transparent substrate 10 and the second transparent substrate 20 can be made of PET (Polyethylene Terephthalate). The third transparent substrate 3 can be a glass. The first transparent substrate 10 has a thickness between 150 µm and 200 µm, and the second transparent substrate 20 has a thickness between 100 µm and 150 µm.

Moreover, in the embodiment of FIG. 3, the first transparent substrate 10 of the anti-reflection coating structure 1 faces the third transparent substrate 3, and the anti-electromagnetic wave coating module 21 of the anti-electromagnetic wave coating structure 2 faces the third transparent substrate 3. However, above-mentioned stacked type among the anti-reflection coating structure 1, the third transparent substrate 3 and the anti-electromagnetic wave coating structure 2 does not used to limit the present invention. For example, there are other three stacked types that can be applied to the present invention, as follows:

1. First stacked type: the anti-reflection coating module 11 of the anti-reflection coating structure 1 faces the third transparent substrate 3, and the second transparent substrate 20 of the anti-electromagnetic wave coating structure 2 faces the third transparent substrate 3.

2. Second stacked type: both the first transparent substrate 10 of the anti-reflection coating structure 1 and the second transparent substrate 20 of the anti-electromagnetic wave coating structure 2 face the third transparent substrate 3.

3. Third stacked type: both the anti-reflection coating module 11 of the anti-reflection coating structure 1 and the anti-electromagnetic wave coating module 21 of the anti-electromagnetic wave coating structure 2 face the third transparent substrate 3.

Therefore, the coating structure with the anti-reflection function and the anti-electromagnetic wave function of the present invention has some advantages, as follows:

1. The coating structure of the present invention is used in the optical-electrical industry that needs the anti-reflection layer to be the raw material (such as LCD, computer goggles, glasses, high-class display, FED, or photo sensor). It produces the boards that are cheap and has high quality.

2. The coating structure of the present invention has a highly conductive property for EMI (Electromagnetic Interference) shielding, has low reflectivity for optical viewing, is highly scratch resistance for surface hardness, and has moderate light attenuation effects for manufacturing PDP displays.

3. The coating structure of the present invention has good electrical conductive properties, so that the work in the grounding process can be reduced and the total yield and reliability in high volume production can be increased.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A coating structure with an anti-reflection function and an anti-electromagnetic wave function, comprising:

an anti-reflection coating structure having a first transparent substrate and an anti-reflection coating module formed on the first transparent substrate; wherein the anti-reflection coating module is composed of a plurality of first oxide coating layers and a plurality of second oxide coating layers that are alternatively stacked upon each other, and each first oxide coating layer has a refractive index larger than that of each second oxide coating layer;

an anti-electromagnetic wave coating structure having a second transparent substrate and an anti-electromagnetic wave coating module formed on the second transparent substrate; wherein the anti-electromagnetic wave coating module is composed of a plurality of compound coating layers and a plurality of metal coating layers that are alternatively stacked upon each other, and each compound coating layer has a refractive index larger than that of each metal coating layer;

wherein one compound coating layer closest to the second transparent substrate is $TiO_2$, the other compound coating layers are ZnO:Al, and each metal coating layer is Ag (silver); and a third transparent substrate disposed between the anti-reflection coating structure and the anti-electromagnetic wave coating structure; wherein the third transparent substrate is glass.

2. The coating structure as claimed in claim 1, wherein both the first transparent substrate and the second transparent substrate are made of PET (Polyethylene Terephthalate), the first transparent substrate has a thickness between 150 µm and 200 µm, and the second transparent substrate has a thickness between 100 µm and 150 µm.

3. The coating structure as claimed in claim 1, wherein each first oxide coating layer is a metal oxide, and each second oxide coating layer is a non-metal oxide.

4. The coating structure as claimed in claim 1, wherein each first oxide coating layer is made of ITO (Indium Tin Oxide), $Nb_2O_5$ or ZnO, and each second oxide coating layer is made of $SiO_2$.

5. The coating structure as claimed in claim 1, further comprising two adhesive layers respectively disposed between the anti-reflection coating structure and the third transparent substrate and between the third transparent substrate and the anti-electromagnetic wave coating structure.

6. The coating structure as claimed in claim 1, wherein the first transparent substrate of the anti-reflection coating structure faces the third transparent substrate, and the anti-electromagnetic wave coating module of the anti-electromagnetic wave coating structure faces the third transparent substrate.

7. The coating structure as claimed in claim 1, wherein the anti-reflection coating module of the anti-reflection coating structure faces the third transparent substrate, and the second transparent substrate of the anti-electromagnetic wave coating structure faces the third transparent substrate.

8. The coating structure as claimed in claim 1, wherein both the first transparent substrate of the anti-reflection coating structure and the second transparent substrate of the anti-electromagnetic wave coating structure face the third transparent substrate.

9. The coating structure as claimed in claim 1, wherein both the anti-reflection coating module of the anti-reflection coating structure and the anti-electromagnetic wave coating module of the anti-electromagnetic wave coating structure face the third transparent substrate.

* * * * *

UNITED STATES PATENT AND TRADEMARK OFFICE
CERTIFICATE OF CORRECTION

| | | |
|---|---|---|
| PATENT NO. | : 7,833,628 B2 | Page 1 of 1 |
| APPLICATION NO. | : 12/007063 | |
| DATED | : November 16, 2010 | |
| INVENTOR(S) | : Cheng-Chieh Chang, Shiu-Feng Liu and Pi-Jui Kuo | |

It is certified that error appears in the above-identified patent and that said Letters Patent is hereby corrected as shown below:

IN THE TITLE PAGE:

ITEM [73] DELETE THE ASSIGNEE NAME "INNOVATION & INFINIGY GLOBAL CORP." AND INSERT THEREFORE THE CORRECT ASSIGNEE NAME --INNOVATION & INFINITY GLOBAL CORP.--

Signed and Sealed this
Twenty-fifth Day of January, 2011

David J. Kappos
*Director of the United States Patent and Trademark Office*